(12) United States Patent
Hasegawa et al.

(10) Patent No.: US 7,532,020 B2
(45) Date of Patent: May 12, 2009

(54) PROBE ASSEMBLY

(75) Inventors: Yoshiei Hasegawa, Kanagawa-ken (JP);
Masashi Hasegawa, Tokyo (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/757,888

(22) Filed: Jun. 4, 2007

(65) Prior Publication Data

US 2008/0007282 A1 Jan. 10, 2008

(30) Foreign Application Priority Data

Jun. 26, 2006 (JP) .............................. 2006-175467

(51) Int. Cl.
*G01R 31/02* (2006.01)

(52) U.S. Cl. ........................... 324/754; 324/757; 439/66

(58) Field of Classification Search ......... 324/754–758, 324/761–762, 765; 439/482
See application file for complete search history.

(56) References Cited

U.S. PATENT DOCUMENTS

| | | | | |
|---|---|---|---|---|
| 6,847,221 B2 * | 1/2005 | Kimoto et al. | .............. | 324/762 |
| 7,156,706 B2 * | 1/2007 | Brown et al. | ................. | 439/862 |
| 7,285,966 B2 * | 10/2007 | Lee et al. | ..................... | 324/754 |
| 7,377,788 B2 * | 5/2008 | Hasegawa | ..................... | 439/66 |
| 2005/0253607 A1 * | 11/2005 | Kimoto | ....................... | 324/754 |

FOREIGN PATENT DOCUMENTS

| | | |
|---|---|---|
| JP | 10-282147 | 10/1998 |
| JP | 2001-230288 | 8/2001 |
| JP | 2005-201844 | 7/2005 |

* cited by examiner

*Primary Examiner*—Ha Tran T Nguyen
*Assistant Examiner*—Arleen M Vazquez
(74) *Attorney, Agent, or Firm*—Ingrassia Fisher & Lorenz, P.C.

(57) ABSTRACT

A probe assembly having a plurality of probes, each of which is secured to an anchor portion on a probe base plate, extends in a direction apart from the anchor portion through a fulcrum, has a tip at the front end thereof, and the tip is elastically deformable at its front end side when pressed against a corresponding electrode pad. Two probe groups are constituted: in the first group, the tips are arranged on one side of an imaginary straight line of the probe base plate, while in the second probe group, the tips are arranged on the other side of the imaginary straight line. The numbers of the probes of both probe groups are different, and a part of the probes forming one probe group with more probes are arranged in the opposite direction to that of the other probes of the same probe group.

10 Claims, 6 Drawing Sheets

PROBE ASSEMBLY

TECHNICAL FIELD

The present invention relates to a probe assembly for use in an electrical test of a flat plate-like device under test such as a semiconductor wafer into which an IC (integrated circuit) is incorporated.

BACKGROUND

In producing IC chips, generally a plurality of chip regions formed in a matrix state on a semiconductor wafer are partitioned, and an electronic circuit for an IC for each chip region is formed collectively. In the semiconductor wafer with these plural IC circuits built in, the chip regions are finally divided along scribe lines, thereby being separated into multiple IC chips. The semiconductor wafer with such IC circuits incorporated into is subjected to an electric test prior to dividing into respective chips by use of a probe assembly as disclosed, for example, in "Patent Document 1" cited below.

This probe assembly comprises a probe unit supported on a support table. Each probe of the probe unit has an inclined arm portion. Each inclined arm portion is extended from the support table obliquely downward toward the semiconductor wafer held by a vacuum chuck. An extended end, that is, the front end of each inclined arm portion is provided with a tip capable of contacting a corresponding electrode formed in each chip region of the semiconductor wafer. When the tip of each probe of the probe assembly is pressed toward the corresponding electrode, the tip of each probe is surely pressed against the corresponding electrode by taking advantage of flexural deformation of each inclined arm. By this pressing against the electrode, each electrode is connected to a tester body through the corresponding probe for an electrical test.

According to the probe assembly of the above-mentioned Patent Document 1, the arms are aligned to be inclined in one direction as well as in the other direction opposite to it according to the alignment of the corresponding electrodes. Because of this, with the flexural deformation of each inclined arm, a biasing force acts on the semiconductor wafer. However, as long as the IC circuit formed in each chip region is, for example, an IC circuit such as memories in which the same number of electrodes are aligned on both side portions of the chip regions symmetrically, in the probes the arm portions arranged in the opposite directions to each other are symmetrically arranged in correspondence to the each electrode row. The biasing forces due to the flexural deformation of these arms are balanced and set off, so that the biasing forces do not displace on the vacuum chuck the semiconductor wafer held on a vacuum chuck.

Consequently, according to the conventional probe assembly having such a symmetrical pattern in a probe arrangement, no lateral displacement parallel to the face of the vacuum chuck occurs at each test, thereby dispensing with fine adjustment following the displacement and thereby enabling a proper electrical test of each IC circuit formed on the semiconductor wafer.

Patent Document 1: Japanese Patent Appln. Public Disclosure No. 10-282147.

BRIEF SUMMARY

For application to an asymmetrical pattern semiconductor wafer in which the numbers of the electrodes provided on a pair of straight lines are not the same, it is considered to adopt an asymmetrical probe arrangement in correspondence to the numbers of electrodes of respective electrode rows. In this case, however, the numbers of the probes to be arranged in the mutually opposite directions according to the electrode rows in each chip region do not coincide, and the numbers are different from each other. Therefore, the unbalanced biasing force due to the asymmetrical arrangement of the probes has a great value proportional to the product of the difference between the numbers of electrodes on both side portions of each chip region multiplied by the number of the chip regions within the wafer in one sheet of semiconductor wafer in its entirety. Therefore, this great biasing force might cause the semiconductor wafer to be greatly displaced laterally on the vacuum chuck.

When such a displacement is generated, the electrodes in contact with the tips of the probes on the side with more probes having caused the displacement are displaced integrally with the tips contacting the electrodes. The tips, therefore, do not scrape the surface of the corresponding electrodes, and the oxidized films, dusts or the like on the electrodes are not surely removed by the scraping action of the tips. On the contrary, the electrodes in contact with the probes on the side with less probes are displaced in the opposite direction to the displacing direction of the tips contacting the electrodes. Because of this, since a relative displacement distance from the electrodes to which the tips correspond becomes double that in the case where no displacement is caused, there is a fear that the tips might scrape the chip regions of the semiconductor wafer, that is, device regions, passing over the corresponding electrodes.

To prevent the semiconductor wafer from displacing due to the above-mentioned unbalance, it is conceivable to use a conventional probe assembly having such a symmetrical pattern as mentioned above in the probe alignment and apply to a semiconductor wafer with an asymmetrical arrangement pattern wherein the numbers of electrodes aligned on a pair of straight lines are not the same. Even in this case, however, probe tips acting as dummy probes not corresponding to the electrodes on the semiconductor wafer are brought into contact with the semiconductor wafer in a device region provided with no electrode, so that it is not desirable from the point of view of protection of the IC chip region.

So, an object of the present invention is to provide a probe assembly which, in an electrical test of a device under test such as a semiconductor wafer having an asymmetrical arrangement pattern in which the numbers of electrodes aligned on a pair of straight lines are not the same, and which does not cause a great displacement to the device under test and does not give damages to a device region.

The present invention relates to a probe assembly for use in an electrical test of a semiconductor device having a plurality of electrode pads. The probe assembly comprises: a probe base plate and a plurality of probes. The probe base plate is provided with a plurality of anchor portions. The plurality of probes are secured to the corresponding anchor portions and extend in directions to be apart from the anchor portions through fulcrums, and have tips at their front ends. When the tips are pressed against the corresponding electrode pads, the front end side portions from the fulcrums are elastically deformable. The probes form a first probe group with their tips arranged on one side of an imaginary straight line of the probe base plate and a second probe group in which the tips of the probes are arranged on the other side of the imaginary straight line. The numbers of the probes forming both probe groups are different. The probes are arranged such that the direction from the respective fulcrums toward the tips are aligned substantially at right angles to the imaginary straight line. A part of the probes forming at least one of the probe groups with more probes are aligned such that the direction from their fulcrums to their tips is opposite to that of the other probes of the same probe group.

The numbers of probes forming the first and the second probe groups of the probe assembly of this invention are different, but the direction of the part of the probes of at least one probe group with more probes are arranged such that the direction from the fulcrums to the tips opposite to the direction of the other probes of the same probe group. In the one probe group, the number of the probes arranged in the opposite direction to that of the other probes can be suitably selected so that the biasing force due to the elastic deformation of the probes acting on the semiconductor device may be reduced. Thus, the probes arranged in the opposite direction can prevent generation of a great biasing force according to the difference in the numbers of the probes of both probe groups.

The probes forming the first and the second probe groups can be brought into contact with the electrode pads of the semiconductor device. Therefore, these probes do not contact the other parts than the electrode pads of the semiconductor device in testing, and do not act as so-called dummies, so that no such damage as given to the dummy probes is caused to the device region of the semiconductor device.

Thus, in the probe assembly according to the present invention, even by adopting an asymmetrical probe arrangement wherein the numbers of the electrodes on a pair of straight lines are not the same in correspondence to the asymmetrical arrangement pattern, dummy probes are not assembled into the probes, so that no damage is given to the device region of the semiconductor device and that it is possible to reduce the biasing force acting on the semiconductor device in its lateral direction due to the elastic deformation of the probes. Consequently, an electrical test of a semiconductor wafer is realized without causing any great lateral displacement to a device under test such as a semiconductor wafer having an asymmetrical arrangement pattern to electrodes, without necessitating readjustment of positions due to this great displacement, and without giving any damage to the device region.

The probes can be arranged such that, among all the probes forming both probe groups, the numbers of the probes of which the direction from the fulcrums of the probes to the tips is in one direction and those in the opposite direction become substantially the same.

All the probes of the other probe group can be arranged such that the direction of the probes from the fulcrums to the tips become the same direction.

By these arrangements, the lateral biasing force acting on the semiconductor device can be more reduced.

The probe assembly according to the present invention can be constituted by even-numbered (2n) probes (where n is 2 or over). In this case, among the probes, the m-piece (m≠n) probes constitute the first probe group with the respective tips arranged on an imaginary straight line, and the remaining (2n−m) probes constitute the second probe group in which their tips are aligned on the other side of the imaginary straight line. The probes forming one probe group with less probes of the two groups arranged such that the directions from the fulcrums to the tips are the same, and among the probes forming the other probe group, the n-piece probes are arranged in the opposite direction to the arrangement direction of the probes in the one probe group, while the remaining (n−m or m−n) probes are arranged in the same direction as the arrangement direction of the probes of the one probe group.

By this arrangement, the numbers of the probes arranged in the one direction forming both probe groups and the number of the probes arranged in the opposite direction can be made equal, that is, n pieces, the biasing force laterally acting on the semiconductor device can be surely set off.

For each probe, a probe with one end secured to the corresponding anchor portion, a pedestal portion rising from the anchor portion, and an arm portion extending from the front end of the pedestal portion in the extending direction of the pedestal portion angularly laterally can be used. In this probe, the joint part of the arm portion and the pedestal portion acts as the fulcrum.

In the arm portion, a long hole penetrating it can be formed to facilitate the flexural deformation of the arm portion. The long hole can be extended along the longitudinal direction of the arm portion. This long hole may be dispensed with. By forming the long hole, however, irrespective of the rigidity of a metal material forming each probe, a desired proper elasticity can be given to the arm portion of each probe.

The probe assembly, which is constituted by n-piece probes arranged in the one direction and n-piece probes arranged in the opposite direction, can be used for a semiconductor device in which the electrode pads are aligned on imaginary lines parallel to each other on the plane of the semiconductor device, the m-piece electrode pads are aligned on one of the parallel lines and the (2n−m) electrode pads are aligned on the other of the parallel lines. In this case, the probes of the respective probe groups are applied to the correspondence electrode pads on the one and the other corresponding lines of the parallel lines.

Where the semiconductor device is a semiconductor wafer with multiple IC chip regions partitioned, the probes are arranged in correspondence to the respective electrodes provided in the chip regions in the regions on the probe base plate corresponding to the chip regions, and the arrangement pattern is repeated in correspondence to the chip regions on the probe base plate.

According to the present invention, as mentioned above, a probe assembly is provided which would not cause a great lateral displacement to a device under test, in an electrical test of the device under test such as a semiconductor wafer having an asymmetrical arrangement pattern where the numbers of the electrodes on a pair of straight lines are not the same, and which would not give damage to a device region.

DETAILED DESCRIPTION

Figure 1:
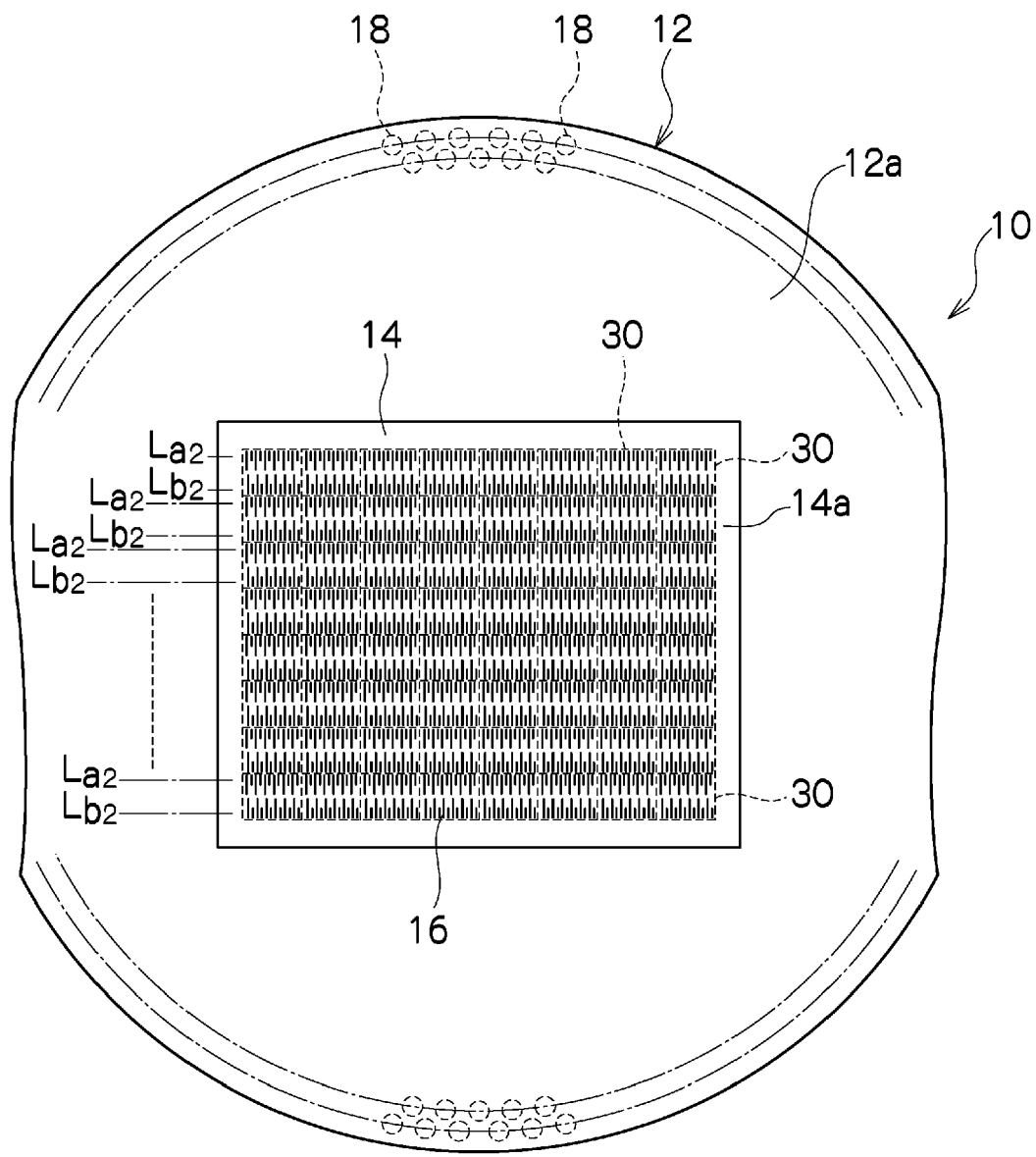
FIG. 1 is a bottom view schematically showing the probe assembly according to the present invention.
Figure 2:
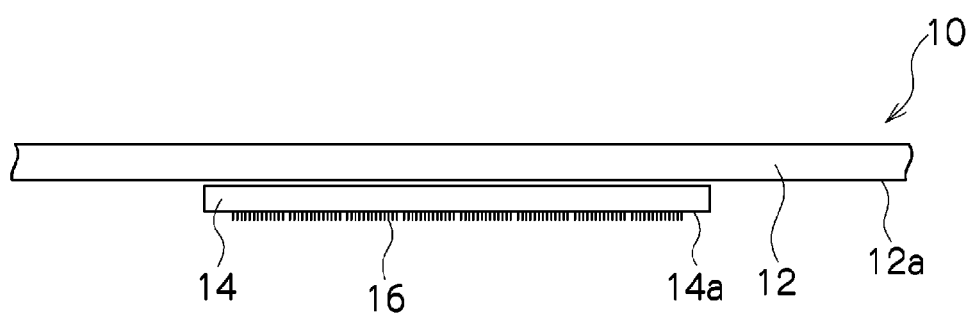
FIG. 2 is a front elevation of the probe assembly shown in FIG. 1.

The probe assembly 10 according to the present invention comprises, as shown in FIGS. 1 and 2: a generally circular wiring board 12; a probe base plate 14 having a rectangular planar shape, attached to the central portion of the underside 12a of the wiring base plate; and a plurality of probes 16 attached to one face 14a of the probe base plate. The probes 16 are, as mentioned later, attached to an anchor portion of the corresponding electrically conducting path formed on one face 14a of the probe base plate 14. The probe base plate 14 is secured to the wiring board, making the other face opposite to the one face 14a where the probes 16 are provided oppose to the underside 12a of the wiring board 12.

The wiring board 12 includes, as is well known heretofore, an electrically insulating board in which an electrically conducting path (not shown) is incorporated. As shown in FIG. 1, a plurality of tester lands 18 as connection ends to a tester body (not shown) are provided in the peripheral portion of the upside of the wiring board 12. Each probe 16 on the probe base plate 14 attached to the wiring board 12 is electrically connected to the corresponding tester land 18 through the corresponding electrically conducting path within the wiring board 12, as in a conventional one.

Figure 3:
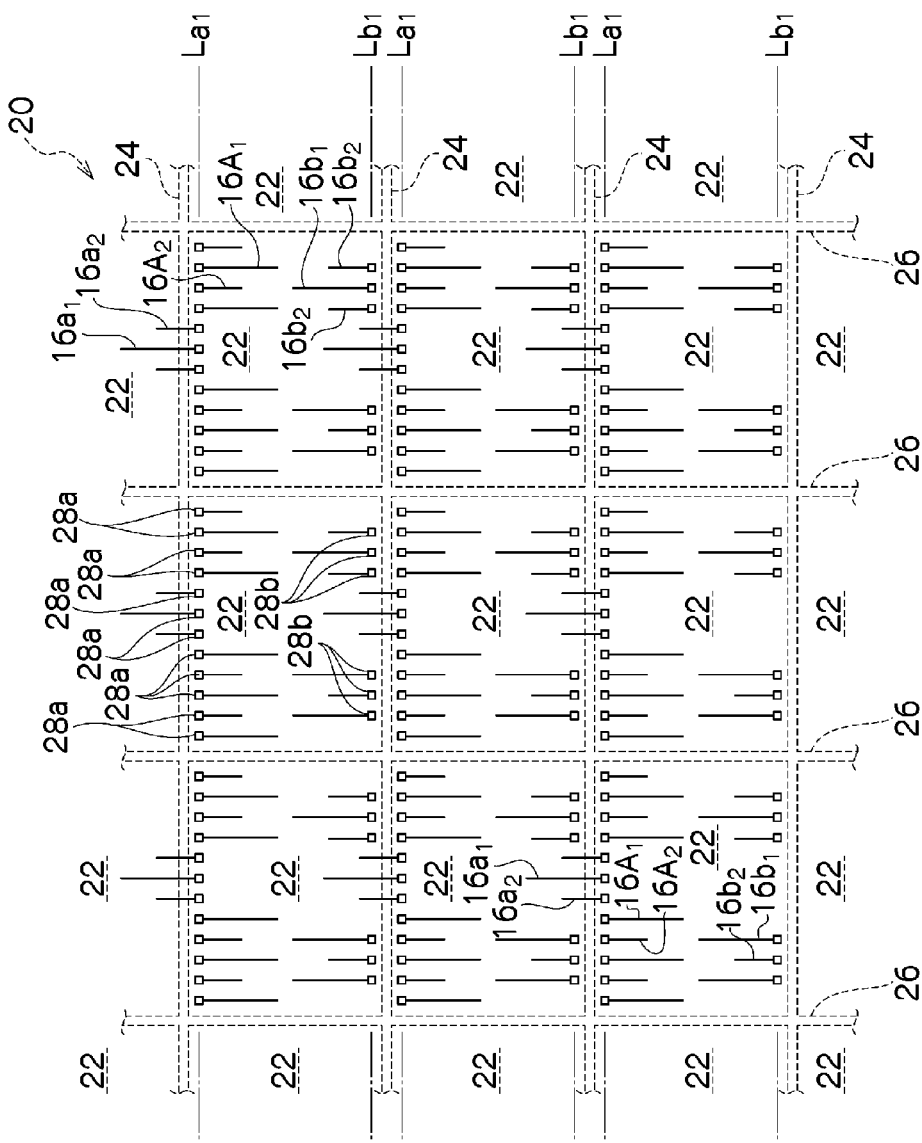
FIG. 3 is an explanatory view of the probe assembly seen from the top to show the physical relation between the electrodes provided in the IC chip regions of the semiconductor wafer under test and the respective probes of the probe assembly shown in FIG. 1.

The probe assembly 10 is, as shown in FIG. 3, for example, used for an electrical test of the plural IC chip regions 22 formed on the semiconductor wafer which is a device under test. The IC chip regions 22, as is well known heretofore, are partitioned by plural scribe lines 24, 26 extending along the straight lines vertically and laterally on the surface of the semiconductor wafer 20, to be aligned vertically and laterally and arranged in a matrix state. Each IC chip region 22 has a rectangular planar shape having long sides parallel to the lateral scribe lines 24 and short sides parallel to the vertical scribe lines 26.

In each chip region 22, a plurality of electrode pads 28 (28a, 28b) are provided along a pair of imaginary lines La1, Lb1 on both side portions along its long sides. Since the IC chip regions 22 are aligned, the plural imaginary lines La1, Lb1 are shared by respective rows. The electrode pads 28a on one side are aligned on each imaginary line La1, and in the illustration, twelve electrode pads 28a are arranged at equal intervals in the longitudinal direction of the IC chip region 22. The other electrode pads 28b are arranged on each imaginary line Lb1, and six electrode pads 28b are arranged in each IC chip region 22 to correspond to the arrangement pitch of the electrode pads 28a on one side. The electrode pads 28a on one side form a first electrode pad group, while the other electrode pads 28b form a second electrode pad group.

Referring to FIG. 1 again, on one face 14a of the probe base plate 14 of the probe assembly 10, probe regions 30 where the probes 16 are provided are aligned so as to vertically and laterally adjoin each other in correspondence to the IC chip regions 22 of the semiconductor wafer 20. In the illustration, 8 by 8 probe regions 30 are vertically and laterally formed in correspondence to a part of the IC chip regions 22. Also, along imaginary lines La2, Lb2 corresponding to the imaginary lines La1, Lb1 which are the alignment lines of the respective pad groups (28a, 28b), the plural probes 16 are arranged orthogonally to the imaginary lines La2, Lb2 so as to correspond to the respective electrode pads 28 (28a, 28b) of each chip region 22 in each probe region 30.

Figure 4:
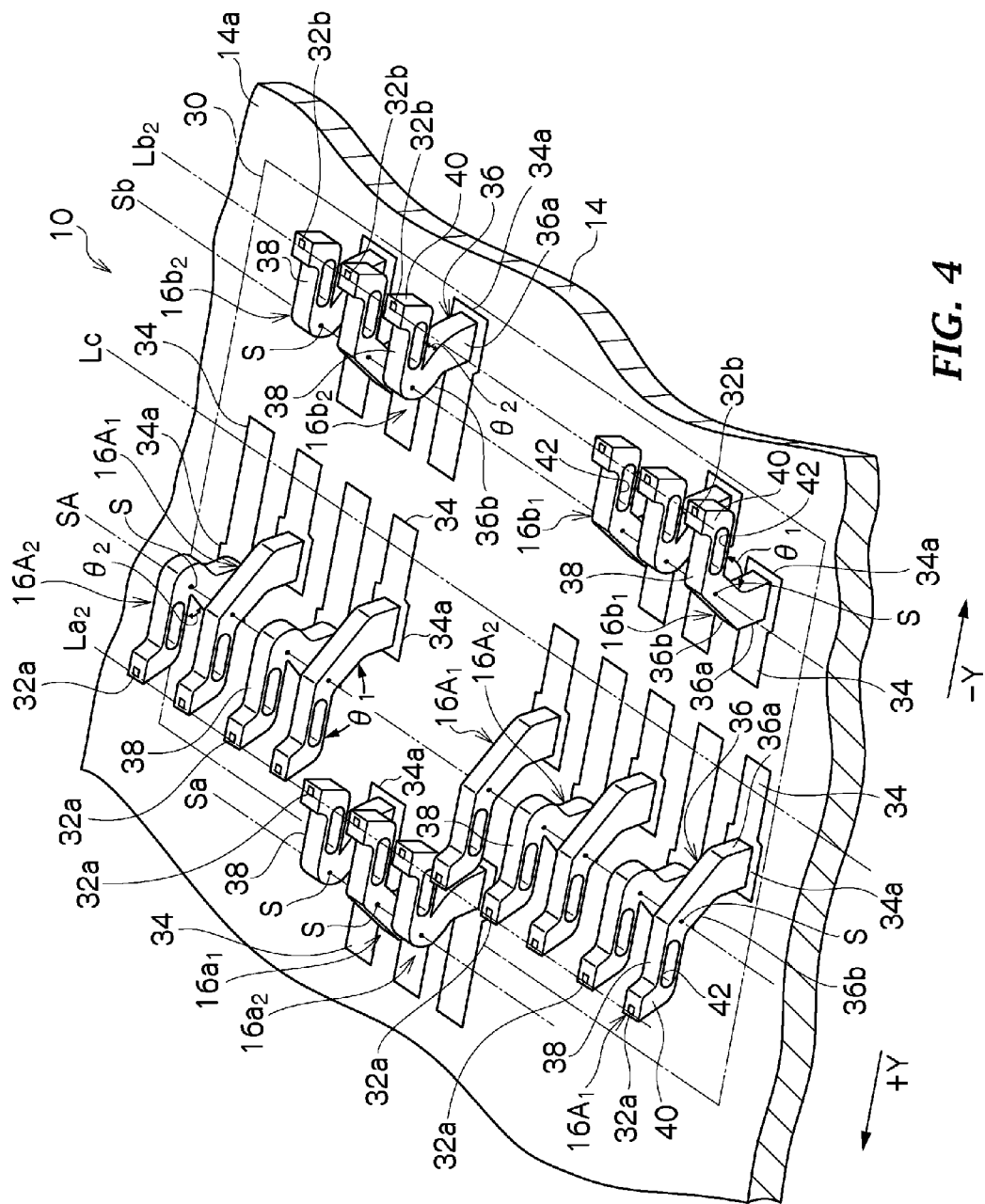
FIG. 4 is a perspective view showing an example of arrangement of the probes of the probe assembly according to the present invention seen from the bottom thereof.

In FIG. 4, the arrangement of the plural probes 16 provided on one face 14a of the probe base plate 14 is exemplified by one probe region 30 corresponding to one IC chip region 22. In the example shown in FIG. 4, the plural probes 16 form a first probe group in which the tips 32a are aligned on the imaginary line La2 so as to correspond to the arrangement line (imaginary line La1) of the first electrode pad group (28a), and a second probe group in which the tips 32b are aligned on the imaginary line Lb2 so as to correspond to the arrangement line (imaginary line La1) of the second electrode pad group (28a). In FIG. 4, the probes (16) of the first probe group are shown by reference numerals 16A1, 16A2, 16a1 and 16a2, respectively, and the probes (16) of the second probe group by reference numerals 16b1 and 16b2, respectively.

All the probes 16 (16A1, 16A2, 16a1, 16a2, 16b1 and 16b2) are basically provided respectively with a pedestal portion 36 secured to the anchor portion 34a of the electrically conducting path 34 formed on one face 14a of the probe base plate 14; an arm portion 38 laterally extending from the pedestal portion; and a tip portion 40 continuous to the front end of the arm portion and including the tip 32 (32a, 32b).

The pedestal portion 36 of each probe 16 includes: as seen in FIG. 4, an upright part 36a rising at right angles to the anchor portion 34a from the base end fixed at the anchor portion 34a corresponding to the probe 16; and an inclined part 36b rising obliquely upward from to top of the upright part. The arm portion 38 of each probe 16 extends in one direction nearly at right angles to the upright part 36a from the top portion of the corresponding inclined part within the same plane as the pedestal portion 36. At the extended end of the arm portion 38, the tip portion 40 is integrally formed with the inclined part 36b and the arm portion 38 within the same plane. The tip portion 40 rises, as seen in FIG. 4, obliquely upward slightly obtusely to the extending direction of the arm portion 38. The tip 32 (32a, 32b) is provided in the front end face of each tip portion 40.

The arm portion 38 extends laterally at right angles from the pedestal portion 36 to the upright part 36a, but the arm portion 38 may be formed such that the angle to the upright part 36a exceeds 90 degrees. It is also possible to dispense with the tip portion 40 provided at the front end of the arm portion 38. In this case, the tip 32 (32a, 32b) is attached directly to a plane parallel to the front end face of the tip portion 40 at the front end portion of the arm portion 38 or formed integrally with the arm portion 38.

When each probe receives a pressing force at its tip 32 (32a, 32b), the arm portion 38 thereof is subjected to a flexural deformation due to its elasticity. At this time, each pedestal portion 36 acts as a rigid body. The flexural deformation of the arm portion 38 is, therefore, a slightly arc-like elastic deformation with the joint part of the arm portion and the pedestal portion 36 as a fulcrum S. To promote this elastic deformation of the arm portion 38, a long hole 42 penetrating the arm portion 38 and opening on both sides thereof is formed in each probe 16. The long hole 42 extends in the longitudinal direction of the arm portion 38.

Of all the probes 16, the probe 16A1, probe 16a1 and probe 16b1 have the same planar shape, the angle between the inclined part 36b and the arm portion 38 showing an obtuse angle $\theta 1$. The probes 16A2, 16a2 and 16b2 have approximately the same planar shape, the angle between the inclined part 36b and the arm portion 38 showing an acute angle $\theta 2$. In order to retain the same mechanical strength at each pedestal portion 36 against the pressing force acting on the tips 32 (32a, 32b), it is desirable to set the sum of the angles $\theta 1$ and $\theta 2$ to be 180 degrees. In all the probes 16, while there is a difference as to whether the angle between the inclined part 36b and the arm portion 38 is the obtuse angle $\theta 1$ or the acute angle $\theta 2$, the dimensions of respective portions including the length from the fulcrums to the tips 32 (32a, 32b) are the same and show approximately the same mechanical strength against the pressing force.

Among the probes 16A1, 16a1 and 16b1 in which the angle between the inclined part 36b and the arm portion 38 is set to be an obtuse angle $\theta 1$, the probes arranged with their tips 32a aligned on an imaginary line La2 without inverting the attitudes are shown by the reference numeral 16A1. And the probes with their tips 32a aligned on the imaginary line La2 such that their attitudes is inverted are shown by the reference numeral 16a1. Further, the probes with their tips aligned on an imaginary line Lb2 such that their attitudes are inverted are shown by the reference numeral 16b1.

Likewise, among the probes 16A2, 16a2 and 16b2 with the angle between the inclined part 36b and the arm portion 38 set to be an acute angle θ2, those with their tips 32a aligned on the imaginary line La2 without inverting their attitudes are shown by the reference numeral 16A2. And the probes with their tips 32a aligned on the imaginary line La2 such that their attitudes are inverted are shown by the reference numeral 16a2. Further, the probes with their tips 32b aligned on the imaginary line Lb2 such that their attitudes are inverted are shown by the reference numeral 16b2.

In other words, small probe groups are formed in which the tips 32a are aligned on the imaginary line La2 and the probes 16A1 and probes 16A2 are alternately disposed. Also, among these small probe groups, the probes 16a1 and probes 16a2 are alternately disposed likewise with their tips 32a aligned on the imaginary line La2. On the other hand, the probes 16b1 and probes 16b2 are alternately arranged with their tips 32b aligned on the imaginary line Lb2. These probes 16 are secured at the upright part 36a of the respective pedestal portions 36 to the anchor portions 34a of the corresponding electrical conducting paths 34.

Thus, along the imaginary La2, the probes (16A1, 16a1) in which the angle between the inclined part 36b and the arm portion 38 is the acute angle θ2 are alternately arranged. Also, along the imaginary line Lb2, the probes (16b1) in which the angle between the inclined part 36b and the arm portion 38 is the obtuse angle θ1 and those (16A2, 16a2) in which the angle between the inclined part and the arm portion is the acute angle θ2 are alternately arranged. By the alternate arrangements, even if the probes 16 with their tips 32 (32a, 32b) aligned on the imaginary lines La2 and Lb2, respectively, are disposed close to each other in the extending direction of the imaginary lines La2, Lb2 in correspondence to an arrangement pitch of the electrode pads 28 (28a, 28b) of the IC chip regions 22, the probes 16 can be disposed with a delay alternately in the lateral direction orthogonal to each imaginary line La2, Lb2. Therefore, the pedestal portion 36 can be secured to the anchor portion 34a of each probe 16 relatively easily.

Consequently, where a relatively broad span for the securing work is ensured between adjacent probes 16 in the extending direction of each imaginary lines La2 and Lb2, the probe 16 can be constituted by those in which the inclined angle is either the obtuse angle θ1 or the acute angle θ2, and the probes of the other configuration may be dispensed with.

In the probes 16A1 and 16A2 whose tips 32a align on the imaginary line La2, the respective fulcrums S align on an imaginary line SA parallel to the imaginary line La2. The imaginary line SA is between the imaginary line La2 and a central imaginary line Lc which is between both imaginary lines La2 and Lb2. Therefore, the direction of the probes 16A1 and 16A2 by seeing their tips 32a from their fulcrums S is Y direction apart from the central imaginary line Lc between both imaginary line La2 and Lb2 at right angles thereto.

On the other hand, in the probes 16a1 and 16a2 whose tips 32a align on the imaginary line La2, their fulcrums S align on an imaginary line Sa parallel to the imaginary line La2. The imaginary line Sa is on the opposite side to the central imaginary line Lc with respect to the imaginary line La2. Therefore, the direction of these probes 16a1 and 16a2, when their tips are seen from their fulcrums, is −Y direction opposite to the Y direction.

In the probes 16b1 and 16b2 whose tips 32b align on the imaginary line Lb2, their fulcrums S align on an imaginary line Sb parallel to the imaginary line La2. This imaginary line Sb is between the imaginary line Lb2 and the central imaginary line Lc. Therefore, in these probes 16b1 and 16b2, the direction seeing their tips 32a from the fulcrums S is, as in the case of the probes 16a1 and 16a2, is the −Y direction opposite to the Y direction.

Anyway, the probes 16A1, 16A2, 16a1 and 16a2 with their tips 32a aligned on the imaginary line La2 form the first probe group, while the probes 16b1, 16b2 with their tips 32b aligned on the imaginary line Lb2 form the second probe group.

Figure 5:
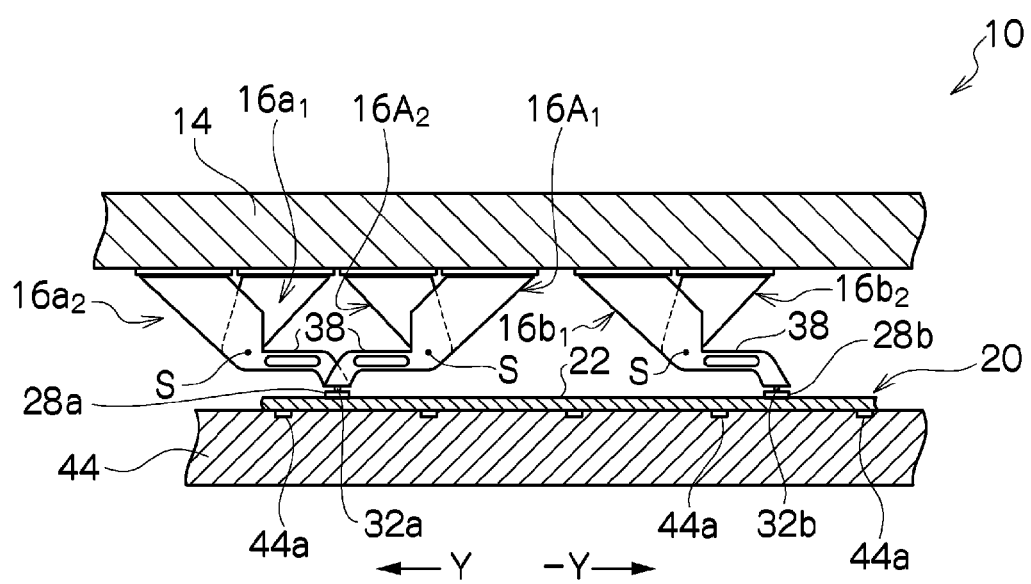
FIG. 5 is a vertical section showing the physical relation between the probes of the probe assembly in FIG. 4 and the electrodes in the IC chip region of the semiconductor wafer.

The probe assembly 10 according to the present invention is, as shown in FIG. 5, applied to an electrical test of each IC chip region 22 of the semiconductor wafer 20 held on the vacuum chuck by an aspiration pressure acting on an adsorption groove 44a of the vacuum chuck 44. For this electrical test, the probe assembly 10 is applied on the semiconductor wafer by making the imaginary lines La2, Lb2 coincide with the imaginary lines La2, Lb1 of the semiconductor wafer 20, so that the tips 32a of the probes 16A1, 16A2, 16a1 and 16a2 of the first probe group may contact the electrode pads 28a of the IC chip regions, and that the tips 32b of the probes 16b1 and 16b2 of the second probe group may contact the other electrode pads 28b of the IC chip regions 22.

When the tips 32 (32a, 32b) of the probes 16 (16A1, 16A2, 16a1, 16a2, 16b1, 16b2) are pressed against the corresponding electrode pads 28 (28a, 28b), an elastic deformation accompanying a slight flexure is caused to the arm portion 38 of each probe 16, making the joint part S with the pedestal portion 36 a fulcrum. Due to an overdrive giving this elastic deformation, a biasing force in the extending direction of the arm portion 38 to each tip 32 (32a, 32b) from the fulcrum S is generated.

As is evident from FIG. 5, in the probes 16A1, 16A2 of the first probe group, this biasing force occurs in the Y direction. On the other hand, in case of the other probes 16a1, 16a2 of the first group as well as the probes 16b1, 16b2 of the second group, the biasing force occurs in the −Y direction opposite to the Y direction.

Referring to FIGS. 3 and 4, eighteen (18) probes 16 in total are provided in the probe region corresponding to each IC chip region 22. Among them, the number of the probes 16A1 and 16A2 causing the biasing force in the Y direction in a state of overdrive is nine (9), while the number of the probes causing the biasing force in the −Y direction in a state of overdrive is 9 which is the sum of 3 other probes 16a1, 16a2 of the first group and 6 probes 16b1, 16b2 of the second probe group. As a result, in the probe regions 30, that is, in the whole area of the probe assembly 10, the biasing forces in the mutually opposite (±Y) directions acting on the semiconductor wafer 20 by the overdrive of the probes 16 cancel each other.

Figure 6:
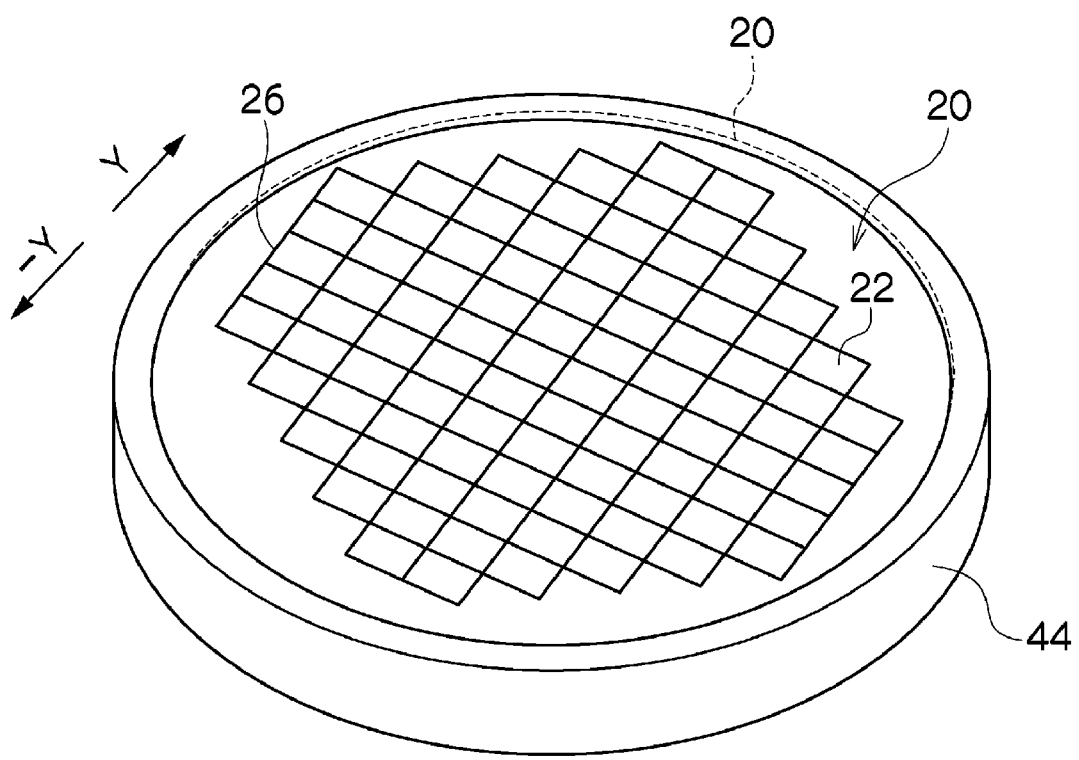
FIG. 6 is a perspective view showing the semiconductor wafer which is a device under test on an adsorption chuck.

If all the probes of the first probe group are constituted by probes 16A1, 16A2, in each probe region 30, the number of the probes 16A1, 16A2 causing the biasing force in the Y direction becomes 12, and the number of the probes 16b1, 16b2 causing the biasing force in the Y direction is 6. Therefore, there is a difference of 6, thereby causing a great unbalance in the biasing forces in both directions. For this reason, when the probe assembly 10 is generally seen, a very great biasing force in one direction (Y direction) proportional to the number of the probe regions 30 acts on the semiconductor wafer 20, thereby sometimes displacing the semiconductor wafer 20 at the vacuum chuck 44 as shown by a broken line in FIG. 6. If such displacement occurs in one test, and if plural tests should be repeated by dividing one semiconductor wafer 20 into plural regions, fine adjustment to position the probe assembly 10 and the semiconductor wafer 20 is required every time.

On the other hand, in the probe assembly 10 according to the present invention, as mentioned above, the biasing forces due to the flexural deformation of the arm portions 38 of the probes are balanced to cancel each other, so that the semiconductor wafer 20 held on the vacuum chuck 44 is not displaced by the biasing forces on the vacuum chuck 44.

Consequently, in an electrical test of a device under test such as the semiconductor wafer 20 having the IC chip regions 22 of an asymmetrical arrangement pattern in which the numbers of electrode pads 28 (28a, 28b) on the respective sides are not the same, there is no causing a great lateral displacement to the device under test. Thus, the contact faces of the electrode pads corresponding to the probes disposed in both directions can be properly scraped, so that a sure electrical connection is obtained between the probes and the electrical pads, thereby enabling an accurate measurement. Also, since there is no such displacement as to require re-positioning at each test, when tests are repeated by dividing one semiconductor wafer 20 into plural regions, working efficiency is remarkably improved.

Furthermore, the biasing forces in both directions can be balanced without providing a dummy probe which contacts the inside of the IC chip region 22, there is no damage within the semiconductor wafer 20 caused by the dummy probe.

The number of probes of each probe group in the foregoing embodiment can be generalized as shown in the following. Supposing the number of all the probes of the probe assembly 10 is 2n (n is a natural number over 2 including 2), one probe group, for example, consists of m (m≠n) pieces of probes, while the other probe group consists of (2n−m) pieces of probes.

Here, supposing n>m, n-piece probes of the other probe group which consists of multiple probes are arranged in one direction (Y direction), and the remaining (n−m) probes of the same other probe group are arranged in the opposite direction (−Y direction). On the other hand, all of the (m-piece) probes of the one group are arranged in the opposite direction (−Y direction)

On the contrary, supposing n<m, of the one probe group, n-piece probes are arranged in one direction (Y direction) and the remaining (m−n) pieces of the probes of the same probe group are arranged in the opposite direction (−Y direction). On the other hand, all the (n-piece) probes of the other probe group are arranged in the opposite direction (−Y direction).

In either case, the numbers of the probes in the one direction (Y direction) and the opposite direction (−Y direction) are n pieces, thereby the canceling the biasing forces mutually.

Each probe 16 includes the tip 32 (32a, 32b) and can be made of a plate-like metal material having a proper high tenacity such as nickel or its alloy. It is desirable, however, to make the tip 32 (32a, 32b) of a highly tenacious metal material such as cobalt or rhodium.

The probes 16 can be made by electrofoaming which is heretofore well known. In this case, the probes 16 are formed in a manner that an electrical conducting material is deposited by electroplating on the photoresist pattern having the planar shape of the probe formed by selectively exposing and developing a photoresist on a working table, and then the photoresist pattern is removed.

In the foregoing is shown an example in which one probe group is formed with more probes on one side of the central imaginary line Lc of the probe base plate 14, while a part of the probes are arranged such that the direction from their fulcrums to the tips 32 is opposite (−Y direction) to the other probes of the same group, and in which, of all the probes forming both probe groups, the numbers of the probes arranged in the one direction and in the opposite direction are equal. However, unless a biasing force to give a substantial displacement to the semiconductor wafer 20 is generated, a slight difference may be set between the numbers of the probes of both probe groups in the probe assembly 10 as a whole.

Also, an example is shown in which all the probes of the other probe group with less probes are arranged such that the directions from the fulcrums to the tips of become the same. It is possible to mix in this other probe group, too, some probes in which the directions become opposite to each other.

The present invention is not limited to the above embodiments but can be variously modified without departing from its purport.

What is claimed is:

1. A probe assembly for use in an electrical test of a semiconductor device having a plurality of electrode pads, comprising:

a probe base plate provided with a plurality of anchor portions; and a plurality of probes secured to corresponding anchor portions through fulcrums, and having arm portions extending in a direction away from said anchor portions, said probes having tips at their front ends, said arm portions of the fulcrums being elastically deformable when said tips are pressed against said corresponding electrode pads, said probes forming a first probe group in which the respective tips are arranged on one side of an imaginary straight line of said probe base plate, and a second probe group in which the respective tips are arranged on the other side of said imaginary straight line;

wherein the number of probes in the first probe group is greater than the number of probes in the second probe group, all of said plurality of probes are arranged such that the direction from their fulcrums to their tips is approximately at right angles to said imaginary straight line, and one or more of said probes in the first probe group are arranged such that the direction from their fulcrums to their tips is opposite to that of the other probes in the first probe group; and wherein the number of said probes is an even number (2n pieces) (where n is a natural number greater than or equal to 2), of which m (m≠n) probes form said first probe group on one side of the imaginary straight line on said probe base plate, the remaining (2n−m) pieces of said probes form said second probe group on the other side of said imaginary straight line, and said probes in the second probe group are arranged such that the direction from their fulcrums to their tips is the same, while n pieces of said probes in the first probe group are arranged to be directed opposite, and the remaining (n−m or m−n) pieces of said probes are arranged in the same direction as that of the probes in the second probe group.

2. The probe assembly claimed in claim 1, wherein the plurality of probes are arranged such that the number of probes with a first direction from their fulcrums to their tips is approximately the same as the number of probes with a second direction from their fulcrums to their tips, wherein the second direction is opposite to the first direction.

3. The probe assembly claimed in claim 2, wherein all the probes in the second probe group are arranged such that the direction from their fulcrums to their tips is the same.

4. The probe assembly claimed in claim 1, wherein each probe is secured at one end to the corresponding anchor portion, and includes a pedestal portion rising from said anchor portion; and an arm portion extending angularly laterally to the extending direction from the front end of said pedestal portion to said pedestal portion, and wherein the joint part of said arm portion and said pedestal portion acts as said fulcrum.

5. The probe assembly claimed in claim 4, wherein said arm portion has a long hole penetrating said arm portion to facilitate a flexural deformation thereof, said long hole extending in the longitudinal direction of said arm portion along said arm portion.

6. The probe assembly claimed in claim 1, wherein said electrode pads of said semiconductor device are arranged on parallel imaginary lines on the plane of said semiconductor device, wherein m-piece electrode pads are arranged on one of said parallel lines, while (2n−m) pieces of said electrode pads are arranged on the other of the parallel lines, and wherein the probes of said probe groups are applied in correspondence to said electrode pads on said one and the other corresponding parallel lines.

7. The probe assembly claimed in claim 1, wherein said semiconductor device is a semiconductor wafer partitioned into multiple IC chip regions, wherein said probes are arranged in correspondence to the electrodes provided in said chip regions in the regions corresponding to said chip regions on said probe base plate, and wherein an arrangement pattern thereof is repeated in correspondence to said chip regions on said probe base plate.

8. A probe assembly for use in an electrical test of a semiconductor device having a plurality of electrode pads, comprising:
   a probe base plate provided with a plurality of anchor portions; and
   a plurality of probes secured to corresponding anchor portions through fulcrums, and having arm portions extending in a direction away from the anchor portions, the probes having front ends and tips at the front ends, the arm portions being elastically deformable when the tips are pressed against their corresponding electrode pads, the probes being arranged in a first probe group in which the respective tips are arranged on one side of an imaginary straight line of the probe base plate, and a second probe group in which the respective tips are arranged on the other side of the imaginary straight line; wherein:
   the number of probes in the first probe group is greater than the number of probes in the second probe group;
   the probes are arranged such that the direction from their fulcrums to their tips is approximately at right angles to the imaginary straight line;
   one or more probes in the first probe group are arranged such that the direction from their fulcrums to their tips is opposite to that of the other probes in the first probe group;
   the tips of the probes in the first probe group are approximately aligned with a first line, and the tips of the probes in the second probe group are approximately aligned with a second line, wherein the first line and the second line are parallel; and
   the number of said probes is an even number (2n pieces) (where n is a natural number greater than or equal to 2), of which m (m≠n) probes form said first probe group on one side of the imaginary straight line on said probe base plate, the remaining (2n−m) pieces of said probes form said second probe group on the other side of said imaginary straight line, and said probes in the second probe group are arranged such that the direction from their fulcrums to their tips is the same, while n pieces of said probes in the first probe group are arranged to be directed opposite, and the remaining (n−m or m−n) pieces of said probes are arranged in the same direction as that of the probes in the second probe group.

9. The probe assembly of claim 8, wherein the imaginary straight line of the probe base plate is located between the first line and the second line.

10. The probe assembly of claim 9, wherein the imaginary straight line of the probe base plate is parallel with the first line and the second line.

* * * * *